(12) United States Patent
Ansell et al.

(10) Patent No.: US 10,366,899 B2
(45) Date of Patent: Jul. 30, 2019

(54) METHOD OF DETECTING A CONDITION

(71) Applicant: SPTS TECHNOLOGIES LIMITED, Newport (GB)

(72) Inventors: Oliver J Ansell, Bristol Avon (GB); David A Tossell, Bristol (GB); Gautham Ragunathan, West Midlands (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 15/626,250

(22) Filed: Jun. 19, 2017

(65) Prior Publication Data

US 2018/0005837 A1 Jan. 4, 2018

(30) Foreign Application Priority Data

Jul. 4, 2016 (GB) .................................. 1611652.7

(51) Int. Cl.
| | | |
|---|---|---|
| *H01S 5/02* | (2006.01) | |
| *H01L 41/338* | (2013.01) | |
| *H01L 21/78* | (2006.01) | |
| *H01L 21/683* | (2006.01) | |
| *H01L 21/67* | (2006.01) | |
| *H01L 21/66* | (2006.01) | |

(Continued)

(52) U.S. Cl.
CPC .... *H01L 21/3065* (2013.01); *H01J 37/32917* (2013.01); *H01J 37/32935* (2013.01); *H01J 37/32963* (2013.01); *H01J 37/32972* (2013.01); *H01L 21/32136* (2013.01); *H01L 21/67063* (2013.01); *H01L 21/6836* (2013.01); *H01L 21/78* (2013.01); *H01L 22/12* (2013.01); *H01L 22/26* (2013.01); *H01L 41/338* (2013.01); *H01L 2221/68327* (2013.01); *H01S 5/02* (2013.01); *H01S 5/0203* (2013.01)

(58) Field of Classification Search
None
See application file for complete search history.

(56) References Cited

U.S. PATENT DOCUMENTS 5,200,023 A * 4/1993 Gifford ............. H01J 37/32871
  204/192.33
6,174,407 B1 * 1/2001 Johnson ............ H01J 37/32935
  118/723 E (Continued)

FOREIGN PATENT DOCUMENTS

| JP | S62190728 A | 8/1987 |
|---|---|---|
| JP | H04206927 A | 7/1992 |
| WO | WO2015/134111 A1 | 9/2015 |

*Primary Examiner* — Stephanie P Duclair
(74) *Attorney, Agent, or Firm* — Volentine, Whitt & Francos, PLLC

(57) ABSTRACT

A method is for detecting a condition associated with a final phase of a plasma dicing process. The method includes providing a non-metallic substrate having a plurality of dicing lanes defined thereon, plasma etching through the substrate along the dicing lanes, wherein during the plasma etching infrared emission emanating from at least a portion of the dicing lanes is monitored so that an increase in infrared emission from the dicing lanes is observed as the final phase of the plasma dicing operation is entered, and detecting the condition associated with the final phase of the plasma dicing from the monitored infrared emission.

20 Claims, 6 Drawing Sheets

(51) Int. Cl.
*H01L 21/3213* (2006.01)
*H01L 21/3065* (2006.01)
*H01J 37/32* (2006.01)

(56) References Cited

U.S. PATENT DOCUMENTS

| | | | | |
|---|---|---|---|---|
| 7,946,759 | B2* | 5/2011 | Davis | G01J 5/0003 374/121 |
| 8,557,682 | B2* | 10/2013 | Holden | H01L 21/78 438/462 |
| 2015/0162244 | A1* | 6/2015 | Holden | H01L 21/3043 438/9 |
| 2016/0104626 | A1 | 4/2016 | Nelson et al. | |
| 2016/0162244 | A1 | 6/2016 | Christmas et al. | |

\* cited by examiner

METHOD OF DETECTING A CONDITION

BACKGROUND

This invention relates to a method of detecting a condition associated with a final phase of a plasma dicing process. The invention relates also to associated apparatus.

Plasma dicing is a well known technique in which dies are singulated using a plasma etch process. Typically, the dies are formed from a semiconductor material such as silicon and are used in electronic applications. The process of plasma dicing can generate a significant amount of heat due to exothermic chemical reactions, ion bombardments and emission from the plasma. Additionally, it is usual to heat the plasma etch chamber to an elevated temperature, typically around 60° C., to ensure that by-products are volatile. The volatile by-products can then be pumped away. In particular, in silicon etching using a fluorine based plasma, the enthalpy of formation of the reaction $Si+4F \rightarrow SiF_4$ is 1.615 MJ/mol. This is extremely exothermic and results in a significant heat load.

The dicing of other semiconductor substrates can have high associated thermal budgets as well. For example, the dicing of GaAs wafers using chlorine based plasma chemistry can have a high thermal budget due to the continuous RF power applied to the wafer during the dicing process. For a 150 mm diameter wafer, this can be of the order of several hundred Watts. This heat load is in addition to the positive enthalpy of formation of gallium chloride (211 kJ/mol) and arsenic chloride (123 kJ/mol).

Because of the high temperatures associated with the plasma dicing process, it is usual to cool the substrate. Typically, the substrate is clamped to a cooled platen using electrostatic or mechanical methods or a combination of both methods. It is common to the mount the substrate on a frame using tape. The tape that is used for this purpose is typically formed from a polymeric material having one or more adhesive layers formed thereon. Care has to be taken to keep the polymeric mounting tape cool to avoid deformation or 'burning'. 'Burning' can occur when the tape is heated beyond its thermoplastic (glass) transition point, or when a chemical reaction occurs between the tape and active species in the plasma, or when the tape decomposes into constituent polymeric compounds. In the latter case some of the constituent polymeric compounds may change phase into liquid form. Additionally, the heat load can cause out-gassing, which creates a pocket of trapped gas underneath the tape which may appear as a blister and initiate the 'burning' state. Therefore, the damage caused by tape deformation and 'burning' can be quite substantial. Significant damage to both the front side and the back side of the taped frame can occur during the plasma dicing process. Furthermore, outgassing increases the pressure in the wafer backside, and this can cause the wafer to declamp. A declamped wafer loses thermal contact with the temperature controlled surface of the platen and overheats rapidly. This can cause the tape to melt. Declamping from the platen can be very difficult to detect using conventional methods such as helium coolant gas leakage or capacitative sensing. In the case of a thinned, possibly singulated wafer, with no mechanical stiffness, localised declamping is possible.

It is known to monitor optical emission in order to determine the plasma dicing end point. It is also known to use the end point detection of the singulation breakthrough to automatically adjust the etching process to a less energetic etch rate or a 'soft landing' mode. However, this approach has a fundamental flaw. This is because the optical emission end point technique can only signal the singulation event itself. This too late in the process to properly prevent overheating of the tape, because the high temperatures that can cause the burning of the tape have already occurred earlier in the dicing process.

One solution to this problem is to adjust the etch to a less energetic, lower etch rate or 'soft landing' mode prior to the end point. The point at which the adjustment is made is estimated, based on the nominal wafer thickness and expected etch rate. The lower etch rate is then used through to the singulation end point. The singulation can be optically detected and further automatic process adjustment can be applied as necessary. This approach is not particularly satisfactory because it based on estimates. In particular, this approach is less than ideal if the wafer thickness is not consistent. If the wafer thickness is not consistent, then the etch times will vary and this will result in the estimated point at which the 'soft landing' mode is activated being inaccurate. For example, for a typical dicing after grind (DAG) application, the bulk silicon etch rate will be of the order of 22 microns/min, the low etch rate will be around 16 microns/min and the 'soft landing' etch rate will be about 6 microns/min. For a 100 micron thick wafer set to etch at 22 microns/min to a target depth of 95 microns before switching to a etch rate of 6 microns/min, the plasma dicing process will take approximately 5.2 minutes. However, if the wafer-to-wafer thickness variation is 105±5 microns the thickest wafer will take 6.8 minutes to etch. If the point at which the soft landing mode is activated is set to ensure that the thinnest wafers can be treated satisfactorily, then it follows that the thickest wafer will be subject to an extended period of time during which a low etch rate is used. This is undesirable from a manufacturing perspective. In the back-end electronic packaging industry, there are many application types and wafers of many different thicknesses are processed. A system that can etch at a high rate until the end point is approached would be extremely desirable.

SUMMARY

Therefore there is a real need to detect when the plasma dicing process has entered its final phase, prior to the singulation breakthrough in a dicing lane. The process conditions could then be adjusted accordingly. Although the need is particularly acute with substrates mounted on taped frames, the need applies also to the processing of substrates that are not mounted on taped frames. There is a general desire to actually adjust process conditions in the final phase of the plasma dicing process in order to optimise heat management and other process considerations.

Furthermore there is a need to detect the end point of the wafer dicing process without the need for an expensive optical emission spectrometer. It would be highly desirable to provide a way of predicting the end point instead of, or in addition to, directly detecting the end point when it occurs. This would enable certain desirable operations (such as those discussed above) to be performed in advance of the completion of the dicing process. However, at the present time, there is no available technique which uses empirical data to allow the end point as a plasma dicing end point to be predicted.

The present invention, in at least some of its embodiments, addresses some or all of the above mentioned problems, needs and desires.

According to a first aspect of the invention there is provided a method of detecting a condition associated with a final phase of a plasma dicing process comprising the steps of:

providing a non-metallic substrate having a plurality of dicing lanes defined thereon;

plasma etching through the substrate along the dicing lines, wherein during the plasma etching infrared emission emanating from at least a portion of the dicing lanes is monitored so that an increase in infrared emission from the dicing lanes is observed as the final phase of the plasma dicing operation is entered; and detecting the condition associated with the final phase of the plasma dicing from the monitored infrared emission.

The present inventors have realised that infrared emission from the dicing lanes can be an excellent indicator that the end point of the plasma dicing process is approaching. It is surprising that infrared emission from the dicing lanes can act as an effective indicator of the final phase of the plasma dicing process. This is because, as explained earlier, there is a significant amount of heat generated during the plasma dicing process through sources such as the plasma itself and heat which is further applied to the plasma etch chamber to ensure the by-products are volatilised.

At least one process variable may be altered in response to the detection of the condition. The process variable may be altered to adjust the plasma etching. For example, the plasma etching may be adjusted to reduce the rate of etching of the substrate. The skilled reader will appreciate that there are various process variable s which might be altered in order to achieve a desired adjustment of the plasma etching. For example, the rate of etching of the substrate might be reduced by adjusting the power coupled into the plasma. This may be a RF power or other suitable form of power that can drive a plasma. Other process variables, such as gas flows, might be adjusted as is known to the skilled reader.

The process variable may be altered to control a temperature associated with the plasma dicing process. Typically, the process variable is altered to adjust the plasma etching. However, in principle, other process variables may be altered to control the temperature associated with the plasma dicing process. For example, the substrate may be disposed on a substrate support. The substrate support may be cooled. The process variable that is altered may be the cooling of the substrate support.

The plasma etching may be stopped in response to the detection of the condition.

The condition may be the approach of the end point.

The condition may be the end point. The end point may be predicted in advance based on the observation of an increase in infrared emission from the dicing lanes. The end point may be predicted by comparison of the increase of infrared emission from the dicing lanes with a numerical model.

Alternatively, the end point may be directly detected from the monitored infrared emission. In these embodiments, the increase in infrared emission from the dicing lanes observed as the final phase is entered may be followed by a decrease in infrared emission. The decrease in infrared emission may be directly indicative of the end point.

The substrate may be attached to a frame with a tape. The frame may be disposed on a substrate support such as a platen. A process variable may be altered in response to the detection of the condition. In these embodiments, the process variable may be altered to control the temperature of the tape. The process variable may be altered to maintain the temperature of the tape below an upper limit. The upper limit may be set so as to avoid heat induced damage to the tape such as burning, blistering, or outgassing.

The substrate may be disposed on a substrate support such as a platen without employing a frame and tape arrangement.

The substrate may be a semiconductor substrate.

The substrate may be silicon.

The substrate may be GaAs, GaN, InP or SiC.

Alternatively, the substrate may be a dielectric substrate. The substrate may be a glass or a substrate formed from an epoxy material.

The plasma etching may be performed using a cyclic etch and deposition process. The cyclic etch and deposition process may be a process of the kind commonly known as the 'Bosch process', originally described in U.S. Pat. No. 5,501,893.

Conveniently, the infrared emission may be monitored using a pyrometer. This is an extremely cost effective solution. Furthermore, it is possible to monitor the whole of the surface of the substrate or to monitor a portion of the surface of the substrate. A relatively small portion of the surface of the substrate (but greater than the area of an individual die) may be monitored which avoids a requirement for accurate alignment.

Alternatively, an infrared camera may be used to monitor the infrared emission. The infrared camera may be a CCD array. This permits greater detail to be obtained. The whole surface of the wafer or a portion of the surface of the substrate may be monitored. It is also possible to provide improved information in relation to etch uniformity for the centre to the edge of the substrate.

The condition may be a fault condition. The fault condition may be a loss of clamping of the substrate to a substrate support, a breakdown in a passivation layer or a breach in a stop layer at a base of the dicing lanes.

The condition may be related to the uniformity of etching across the substrate. The condition may be related to the uniformity of etching from the edge to the centre of the substrate.

In these embodiments, infrared emission from substantially the whole of the substrate may be monitored.

Typically, the substrate has a mask formed thereon which defines the dicing lanes. The mask may be formed from any suitable material, such as aluminium.

Surprisingly, the invention is equally applicable to substrates that have one or more backside metal (BSM) layers attached thereto and substrates that do not have a backside metallization. The detection of the condition associated with the final phase of the plasma dicing from the monitored infrared emission does not appear to be affected by the presence of a backside metallization.

According to a second aspect of the invention there is provided a plasma dicing apparatus comprising:

a chamber;

a substrate support for supporting a non-metallic substrate of the kind having dicing lanes;

a plasma generator for generating plasma in a chamber suitable to etch through the substrate along the dicing lanes;

an infrared detector for monitoring infrared emissions emanating from at least a portion of the dicing lanes; and a condition detector configured to detect a condition associated with a final phase of the plasma dicing process from the monitored infrared emission.

The infrared detector may be a pyrometer or an infrared camera.

The apparatus may further comprise a controller for altering at least one process variable in response to the detection of the condition. Typically the condition detector and the controller comprise a computer or other microprocessor based device. The condition detector and the controller may be embodied within a single computer or other microprocessor based device.

Whilst the invention is described above it extends to any inventive combination of the features set out above or in the following description, drawing or claims. For example, any feature described in relation to the first aspect of the invention is also disclosed in combination with the second aspect of the invention and visa versa. The skilled reader will understand that the condition detector and/or the controller of the second aspect of the invention may be suitably configured to perform process steps described in relation to the first aspect of the invention.

BRIEF DESCRIPTION OF THE DRAWINGS

Embodiments of methods and apparatus in accordance with the invention will now be described with reference to the accompanying drawings, in which.

DETAILED DESCRIPTION OF EMBODIMENTS

Figure 1:
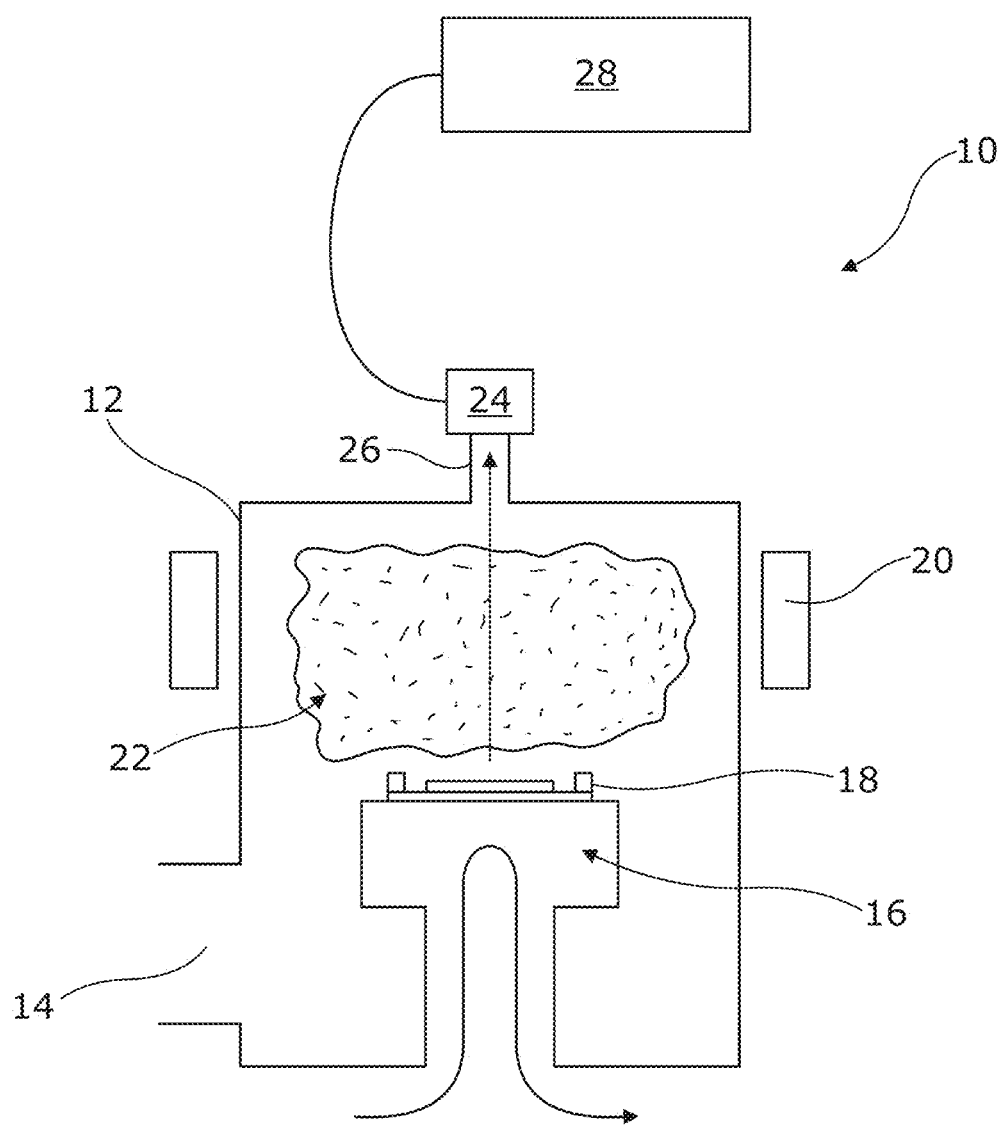
FIG. 1 shows an apparatus of the invention.

FIG. 1 shows a plasma dicing apparatus of the invention, depicted generally at 10. The apparatus 10 comprises a chamber 12 having a wafer loading slot 14. The interior of the chamber 12 houses a platen 16 on which a work piece such as a wafer 18 may be loaded. The platen 16 as shown in FIG. 1 is in a raised position which is adopted during plasma dicing of the substrate. The platen can be moved between this raised position and a lower position. The lower position of the platen is adopted for receiving the substrate through the wafer loading slot. The chamber 12 is surrounded by an inductive coil 20. The inductive coil 20 is connected to a RF power generator (not shown) through an impedance matching network (not shown) as is well known in the art. Suitable etching gas or gases are supplied to the chamber 12 through a gas inlet system (not shown) and RF power is applied to the coil 20 to produce a plasma 22 in the chamber 12. Gases are removed from the chamber using a suitable vacuum exhaust system.

The apparatus 10 further comprises an infrared detector 24 which is mounted so as to monitor infrared emission during the plasma dicing process from the substrate 18. Conveniently, the infrared detector 24 can be mounted on or above the top of the chamber 12. However, in principle, the infrared detector can be mounted elsewhere provided that it is in a position suitable to monitor infrared emission from the substrate 18. In the embodiment shown in FIG. 1 the infrared detector is mounted at one end of a passage way 26 formed in the top section of the chamber 12. Other ways of mounting the infrared detector might be contemplated, such as directly mounting the infrared detector 24 on the top surface of the chamber 12. The infrared detector 24 can be in any suitable form, although it has been found that there are advantages associated with using a pyrometer or an infrared camera such as a CCD array. The apparatus 10 further comprise a controller 28. The controller receives the output of the infrared detector 24 and processes the output in order to detect one or more conditions associated with the final phase of the plasma dicing process. The way in which the controller 28 operates to recognise the condition or conditions is described in more detail below. On recognition of a condition, the controller may act to adjust or otherwise control one or more operations of the apparatus. In particular, the plasma dicing process may be adjusted or halted once a condition associated with the final stage of the plasma dicing process has been detected. The controller 28 may comprise or be connected to a suitable graphical user interface to display information associated with the plasma dicing process. This information can include an indication that the condition has been detected.

Figure 2:
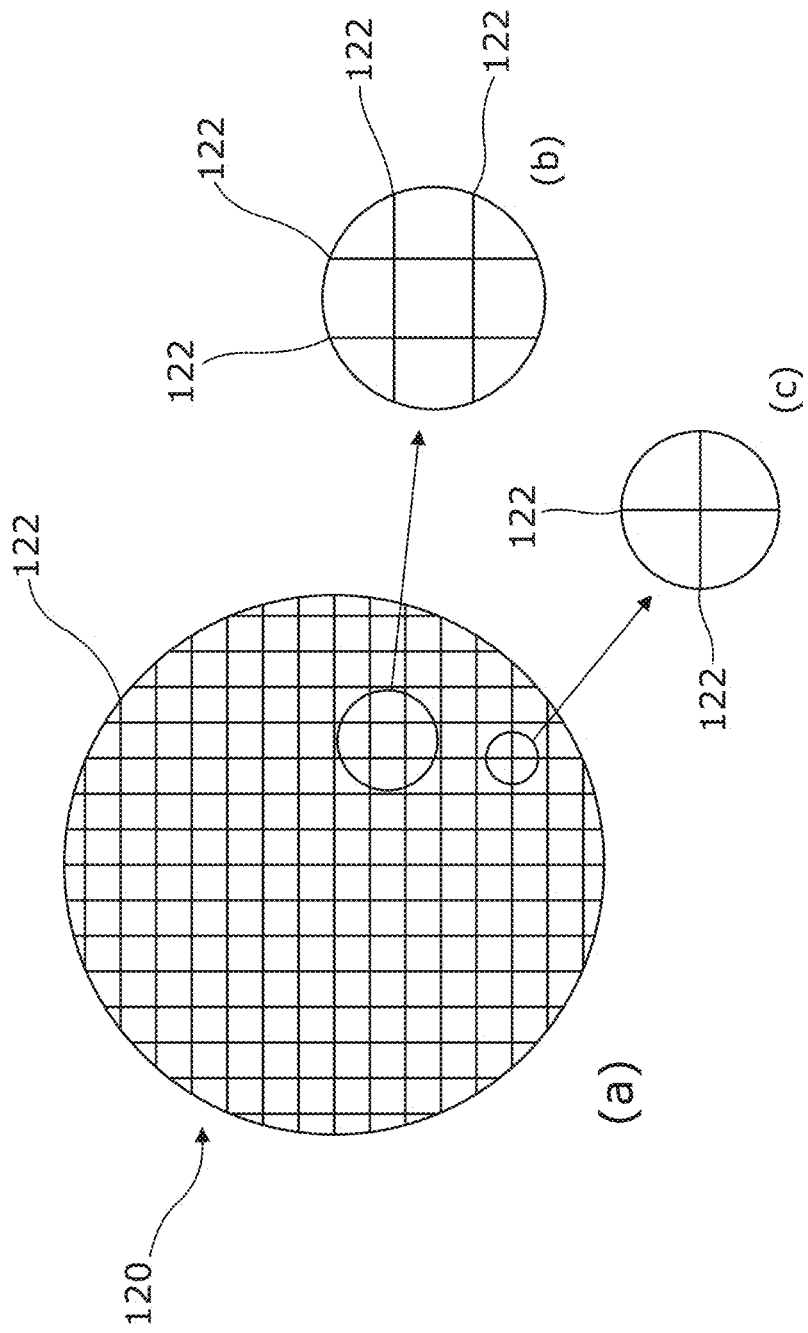
FIG. 2 is a plan view of a substrate wafer with dicing lanes.

FIG. 2 (a) is a plan view of a wafer substrate 120. The wafer substrate 120 has a mask formed on its upper surface from a suitable material such aluminium. The mask defines a plurality of dicing lanes 122. Each dicing lane 122 corresponds to a linear gap in the mask which exposes the underlying material of the substrate to the plasma 22. Typically, a mask is deposited to define a plurality of dicing lanes substantially as shown in FIG. 2, namely a plurality of co-linear dicing lanes extending in one direction and a plurality of co-linear dicing lanes extending in an orthogonal direction. In this way, a cross hatch pattern of dicing lanes is obtained. FIGS. 2(b) and 2(c) show portions of the surface of the substrate wafer 120 in more detail. More particularly, FIG. 2(b) shows a region in which two co-linear dicing lanes intersect with two perpendicular dicing lanes. FIG. 2 (c) shows the intersection of a single dicing lane with a perpendicular dicing lane. The infrared detector may be configured and positioned to monitor the whole of the upper surface of the substrate wafer 120 or monitor just a portion of a substrate wafer 120. For example, the portion shown in FIG. 2(b) or the portion shown in FIG. 2(c) might be specifically monitored. Suitable optics might be employed so that the desired area can be monitored with the infrared detector.

Figure 3:
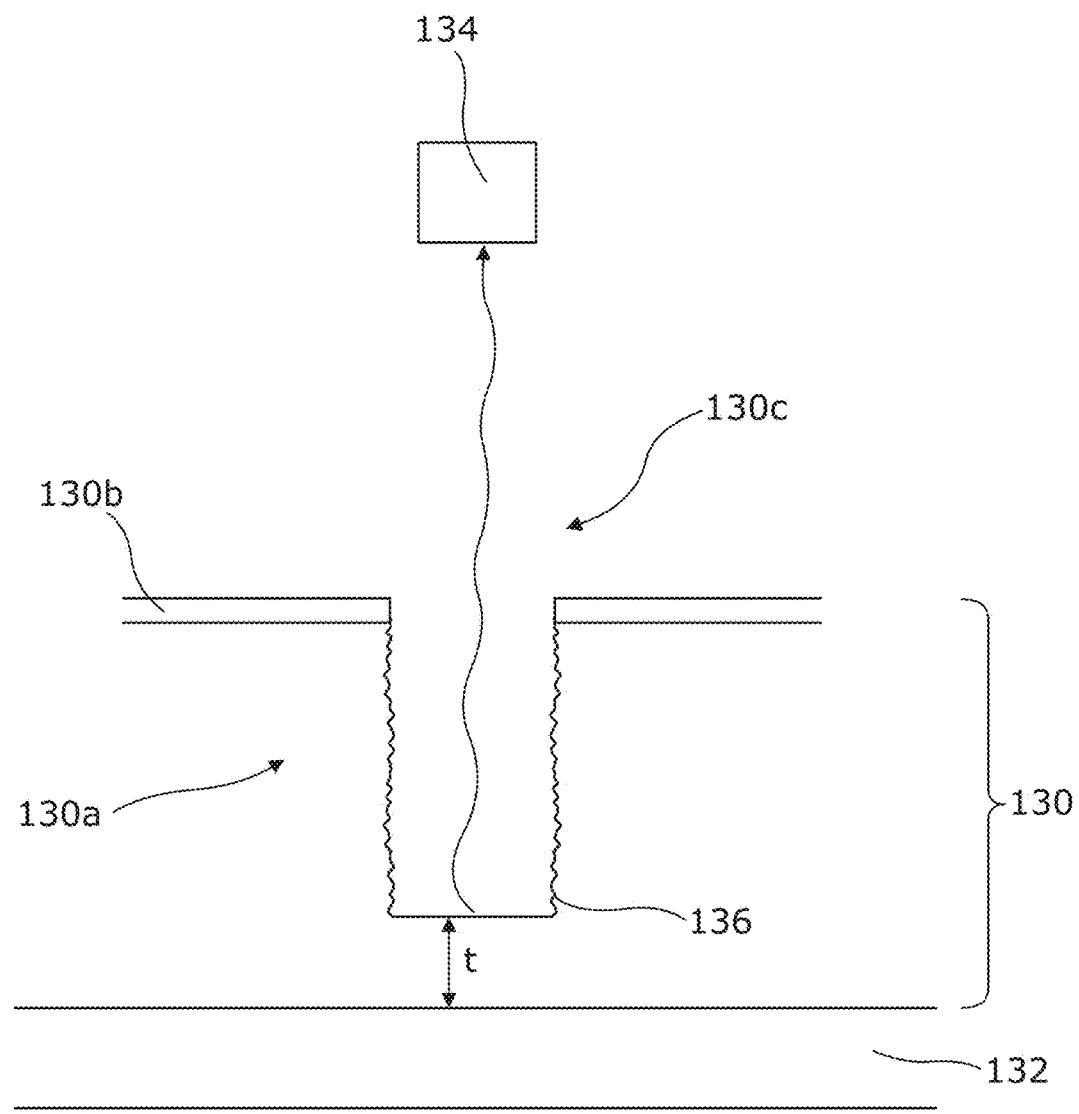
FIG. 3 show the detection of the remaining of material in a dicing lane and includes a cross sectional view of a portion of a substrate.

FIG. 3 shows a cross section of a portion of a wafer substrate 130 during the course of a plasma dicing process. The substrate wafer 130 comprises the bulk substrate material 130a with the mask 130b formed thereon to define a dicing lane 130c. The wafer substrate 130 is mounted on a tape 132 which attaches the wafer substrate 130 to a frame (not shown). In some embodiments the bulk substrate material 130a has a thin layer (up to 5 microns) of a backside metal on its rear surface. The backside metal could be mounted on the tape 132. Also shown in FIG. 3 is an infrared detector 134. The infrared detector 134 is positioned to monitor infrared emission from the dicing lane 130c. The wafer substrate 130 is positioned in a suitable apparatus such as the apparatus shown in FIG. 1. The infrared detector 134 forms part of this apparatus. FIG. 3 shows in semi-schematic form the appearance of the dicing lane 130c after a substantial portion of the plasma dicing process has been completed.

The dicing lane 130c has been substantially etched to form a trench structure. The floor of the trench structure 136 corresponds to the etch front at this point in the process. In the example shown in FIG. 3, a relatively small remaining thickness (t) of material remains to be etched in the dicing lane 130c.

Figure 4:
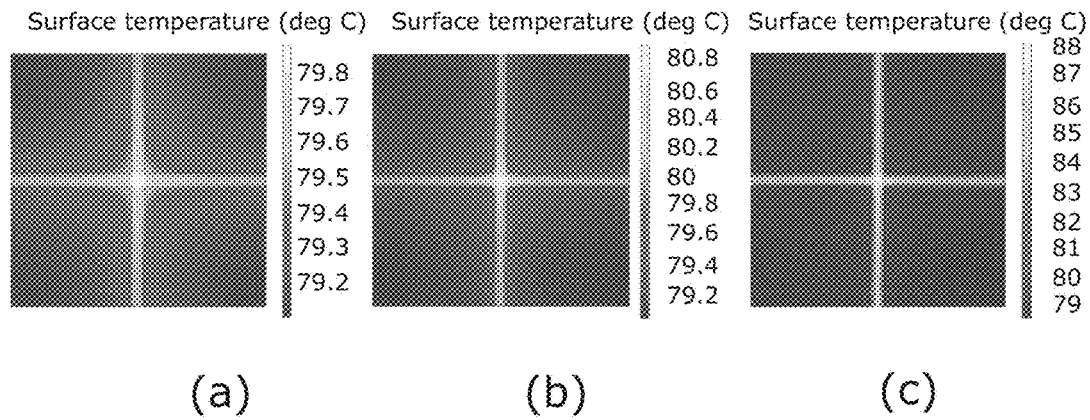
FIG. 4 shows the temperature distribution in the vicinity of a dicing lane obtained from a FEM model as the etch front approaches singulation with (a) 10 microns of silicon remaining (b) 2 microns of silicon remaining and (c) 0.2 microns of silicon remaining.
Figure 5:
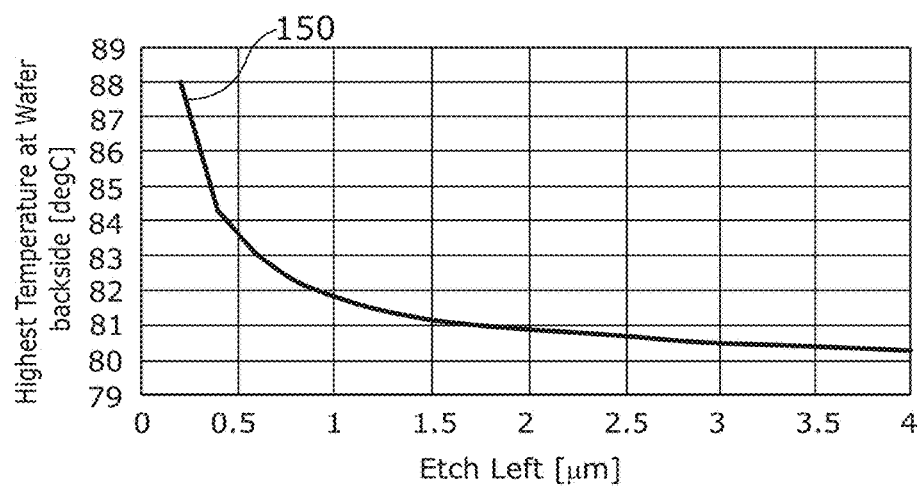
FIG. 5 shows the temperature at the rear of a silicon wafer below a dicing lane as the etch front approaches obtained from a FEM model.

A FEM (Finite Element Method) model has been built to examine the plasma dicing process in more detail when there is a relatively small remaining thickness (t) of substrate remaining to be etched in the dicing lanes. FIG. 4 shows a pictorial sequence of the temperature distribution in the vicinity of a dicing lane. More particularly, the results shown in FIG. 4 correspond generally to the portion of a substrate shown in FIG. 2(c) where two mutually perpendicular dicing lanes intercept. A silicon substrate has been assumed for the purposes for the FEM model. FIG. 4(a) shows the temperature distribution when a 10 micron thickness of silicon remains in the dicing lanes. It can be seen that a substantial amount of heat spreads into the adjacent dies. FIG. 2(b) shows the temperature distribution when a two micron thickness of silicon remains in the dicing lanes. It can be seen that heat transfer into the surrounding dies is far less efficient. FIG. 4(c) shows the temperature distribution when there is only a 200 nm layer of silicon remaining in the dicing lanes. It can be seen that heat transfer into the adjacent dies is minimal and instead the heat flux is concentrated in the dicing lanes. The intersection between mutually perpendicular dicing lanes gives rise to a particularly high heat flux. The FEM is based on a consistent heat load at the different etch depths. The rate of silicon etch and therefore the total heat load generated at the etch front is the same in all instances. Without wishing to be bound by any particular theory or conjecture, it is believed that the results shown in FIG. 4 can be readily explained. Silicon is a relatively good thermal conductor and in FIG. 4(a) the heat generated during the plasma dicing process is spread quite efficiently into the adjacent dies. As the etch proceeds, the remaining thickness of silicon in the dicing lanes reduces. It is believed that this limits the effective conductivity of heat into the surrounding dies. In other words, the lateral heat conductivity of the remaining silicon diminishes as the remaining thickness of silicon reduces. FIG. 5 shows the temperature at the rear of the silicon wafer as the etch front approaches the rear surface of the silicon wafer. The point of singulation is achieved when the etch front reaches the rear surface of the wafer. The same FEM model used to generate the results shown in FIG. 4 is used to generate the temperature curve 150 shown in FIG. 5. It is apparent that as the thickness of remaining silicon in the dicing lane approaches zero, the local temperature directly under the dicing lane increases substantially. The rate of temperature rise increases at around 1.5 microns of remaining silicon and increases substantially with around 500-600 nm of silicon remaining.

Figure 6:
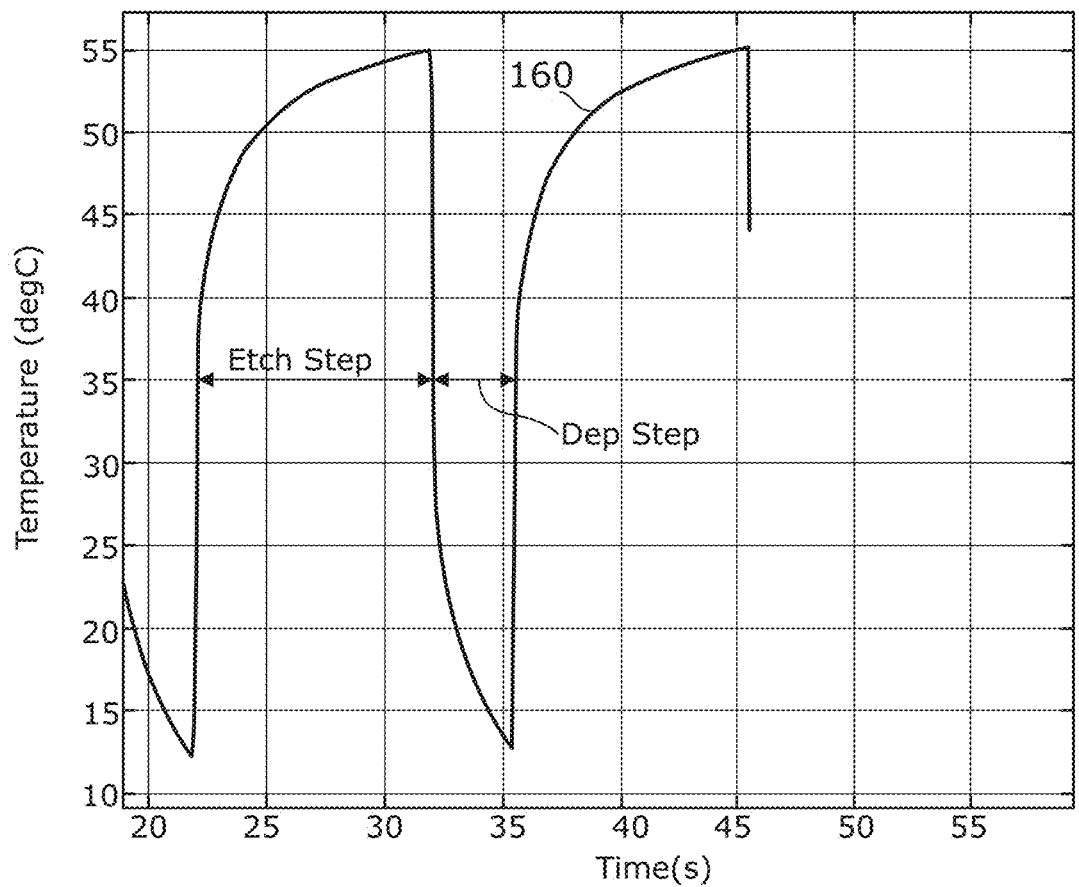
FIG. 6 shows temperature as a function of time at the rear of a silicon wafer below a dicing lane during a cyclic etch and deposition process obtained from a FEM model.

FIGS. 4 and 5 show time averaged temperatures during the silicon etch. With a switched etch process, in which cyclic etch and deposition steps are used, the situation is even more complex as the heat load and etch front temperature follows the alternate etch and deposition cycle. This is show in FIG. 6 which shows the time dependent temperature 160 at the rear of the silicon wafer directly below the etch front during a cyclic (Bosch) silicon etch process. The results are based on the FEM model described above with a periodic time-dependent heat load of arbitrary amplitude.

The present inventors have realised that the final phase of a plasma dicing process, up to and including the singulation end point, can be sensitively detected by monitoring infrared emission from the dicing lanes. Surprisingly, sensitive detection can be achieved against the background thermal emission occurring within a plasma dicing chamber from other energetic heat sources such as the plasma itself. Even more surprisingly, a relatively simple and inexpensive device such as a pyrometer can be used for these purposes. Alternatively, an infrared camera can provide excellent results. The infrared detector monitors in real time the infrared emission from the dicing lanes. The average wafer temperature or the temperature in a specific region of the wafer or in a specific dicing lane can be monitored. Alternatively, the apparatus can monitor for a pre-set maximum temperature to be recorded anywhere in the field of view. The present inventors have realised that the significant rise in temperature in the dicing lanes as the etch front approaches the singulation point its indicative of the final phase of the plasma dicing process being entered. Additionally, this phenomenon enables the final phase to be detected with a good sensitivity by monitoring infrared emission from the dicing lanes. The signal from the infrared detector is fed back to the controller. Once a certain condition has been detected, the controller can switch the process to another mode. This trigger condition may be a certain thickness of material remaining in the lane to be etched. This is possible because the local temperature detected in the dicing lanes is a function of the material remaining in the lane and not the depth etched. Therefore, the controller can recognise how much material remains in the dicing lane to be etched from the signal produced by the infrared detector. For example, the controller can compare the output signal with a numerical model. The mode that the process is switched to may utilise less severe etch conditions to reduce the heat load. For example, a lower etch rate might be used. Alternatively, the etch may completely halted so that a small amount of material remains at the bottom of the dicing lanes.

Figure 8:
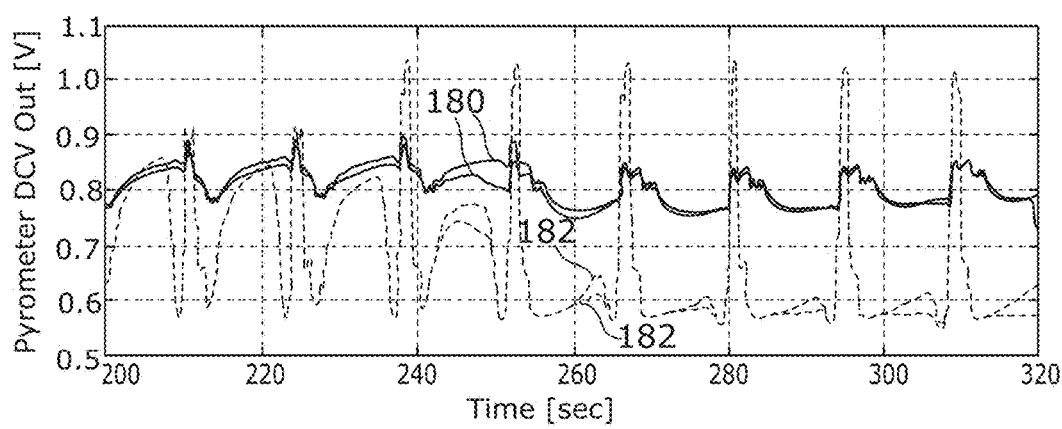
FIG. 8 shows pyrometer (solid) and optical omission (dashed) signals obtained during a plasma dicing process.

If the etch is allowed to proceed to the singulation point where the material in the dicing lanes is completely etched away, then the temperature in the dicing lanes drops abruptly. This is because once the singulation is complete is there is little or no exothermic chemical reaction occurring, so the temperature of the wafer reduces. This can be used as a way of detecting the end point from the infrared emission from the dicing lanes. The detection of the end point can be used to trigger the end of the process. This represents an alternative end point detection method to optical emission based end point detection. It is advantageous to use infrared emission to directly detect the end point for reasons such as cost, simplicity, and a desirability of using the same hardware for end pointing and other process conditions. Experiments have been performed using optical emission based end point detection and detection based on infrared emission from the dicing lane. FIG. 8 shows optical emission signals 182 and signals 180 obtained using a pyrometer. Good agreement is observed between the two sets of signals. In particular, both sets of signals indicate a singulation end point for two separate dicing processes at a time of approximately 250 seconds. The skilled reader will understand that after the end point is reached, many processes run an 'over etch' step to clear a residual material from the etched features. However, the chemical energy realised in the over etch is a fraction of that realised in the main bulk etch. Accordingly, a discernible decrease in infrared emission is still to be expected once the end point is reached.

Moreover, the present invention can be used to predict the end point in advance of its actual occurrence. The end point prediction can be performed in addition to or instead of direct end point detection. This is an extremely advantageous facet of the present invention. The present invention enables the detection of certain conditions associated with the final phase of the plasma dicing process, such as the detection of a certain remaining thickness of material in the dicing lanes.

From this, the time to the end point can be derived using suitable means, such as a numerical model, look up tables, or artificial intelligence. The prediction of the end point can be refined as the etch proceeds. As noted above, process variables can be altered once a given condition has been detected, and any such alteration of process variables can be accounted for when predicting the end point.

Figure 7:
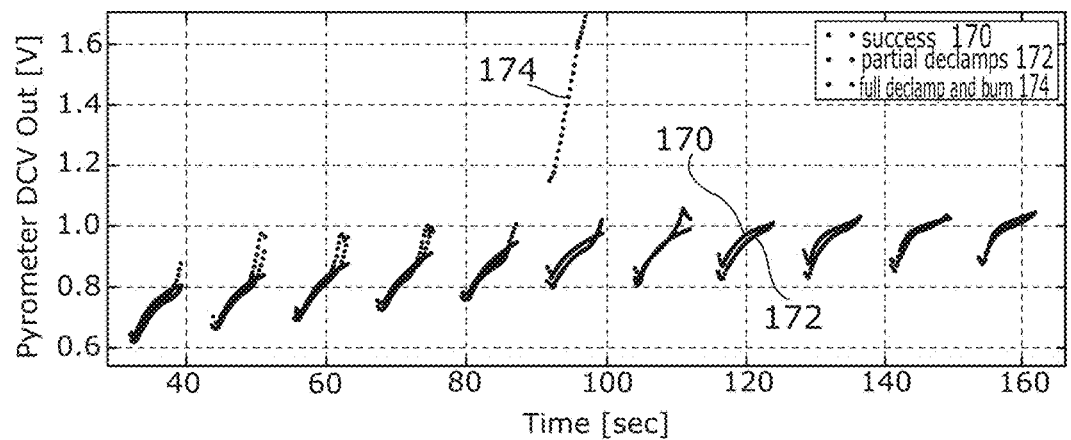
FIG. 7 show pyrometer signal during the etch step of a cyclic etch and deposition process.

Fault detection can also be accomplished. FIG. 7 shows pyrometer signal obtained during the etch steps of a switched (cyclic) etching deposition process. Pyrometer signal 170 (blue data) corresponds to instances of successful clamping of the wafer/tape/frame to a cooled electrostatic chuck. Pyrometer signal 170 corresponds to a partial declamping of the wafer/tape/frame from the electrostatic chuck. Pyrometer signal 174 corresponds to a full declamping of the wafer/tape/frame from the electrostatic chuck. With the instances of successful clamping the temperature rise during each individual etch in the cycle should actually drop with increasing temperature. The temperature increases with time as the etch progresses. When the wafer/tape/frame partially declamps, thermal contact is lost and a greater temperature rise occurs during an individual etch depth. In the case of full declamping, a substantial thermal run away occurs which is manifest in still larger temperature rises during individual etch steps. In this instance, there is serious risk of the tape completely melting. The present invention can be used to detect the occurrence of thermal run away. On detection of declamping and/or thermal run away the controller can abort the etching process and initiate appropriate recovery actions. Another fault can occur when there is a breakdown in the passivation layer on the sidewall of a dicing lane or when a stop layer at the feature base is breached. In these instances chemical heating will occur which can be detected by monitoring infrared emission. This can also be flagged by the controller as a processing fault.

Thermal monitoring of the substrate wafer is possible in a plasma chamber as a large proportion of the signal comes from the infrared radiation emitted by the substrate. This means that the material and the surface of the substrate are less important than might have been expected. For example, the data presented herein were obtained from wafers having an aluminium mask which covers approximately 75% of the surface area of the wafer. However, the cycles of the Bosch process etching are still clearly discernible using a pyrometer as an infrared detector. The surface material of the substrate and the viewing angle of the infrared detector do make a difference to the background layer of the signal due to reflections from the chamber walls. This can make it somewhat difficult to derive an absolute substrate temperature from the infrared emission. However, in many instances, such as fault, end point and uniformity detection, the absolute temperature is not required.

Numerous modifications to the methods and apparatus described above are possible. For example, as described above, the local temperature at the rear of the substrate underneath the dicing lanes increases as the etch front approaches the singulation point. This effect gets stronger as the lateral dimensions of the etch features increase. For very narrow dicing lanes, it is possible that the temperature spike may be below the sensitivity level of a given infrared detector. This may be overcome by including a test structure in the substrate which is within the field of view of the infrared detector. In this way, a more easily detectable local temperature change can be provided. The invention is equally applicable to substrates that have one or more backside metal (BSM) layers attached thereto and substrates that do not. Although the invention has been exemplified in relation to substrates carried on a tape and frame arrangement, this is not a limiting aspect of the invention. Instead, the invention can be applied to systems which do not use a tape and frame arrangement, such a systems in which the substrate is directly supported on a platen or other substrate support.

What is claimed is:

1. A control method of a plasma dicing process, comprising the steps of:
providing a non-metallic substrate having a plurality of designated dicing lanes;
plasma etching through the substrate along the dicing lanes;
during the plasma etching, monitoring emission of infrared radiation by at least a portion of the dicing lanes of the substrate to detect an increase in infrared radiation due to emission of infrared radiation by the dicing lanes; and
determining, prior to singulation of the substrate along the dicing lanes, that a condition associated with a final phase of the plasma dicing process exists when the increase in the infrared radiation has been detected.

2. A method according to claim 1 in which at least one process variable is altered prior to singulation of the substrate along the dicing lines in response to the determination that the condition exists.

3. A method according to claim 2 in which the process variable is altered to adjust the plasma etching.

4. A method according to claim 3 in which the plasma etching is adjusted to reduce the rate of etching of the substrate.

5. A method according to claim 2 in which the process variable is altered to control a temperature associated with the plasma dicing process.

6. A method according to claim 2 in which the plasma etching is stopped in response to the determination that the condition exists.

7. A method according to claim 1 in which the condition is the approach of the end point of the plasma dicing process.

8. A method according to claim 1 in which the condition is the end point of the plasma dicing process.

9. A method according to claim 8 in which the end point is directly determined from the monitored emission of infrared radiation.

10. A method according to claim 9 in which the monitoring comprises detecting for a decrease in infrared radiation, due to emission of infrared radiation by the dicing lanes, after the detection of the increase in the infrared radiation to directly determine the end point of the plasma dicing process.

11. A method according to claim 1 in which the end point of the plasma dicing process is predicted in advance based on the detection of the increase in the infrared radiation emanating from the dicing lanes.

12. A method according to claim 11 in which the end point is predicted by comparing the detected increase of the infrared radiation with a numerical model.

13. A method according to claim 1 in which the substrate is attached to a frame with a tape.

14. A method according to claim 13 in which at least one process variable is altered in response to the determination that the condition associated with the final phase of the plasma dicing process exists to control the temperature of the tape.

15. A method according to claim 1 in which the substrate is a semiconductor substrate.

16. A method according to claim 15 in which the substrate is silicon, GaAs, GaN, InP or SiC.

17. A method according to claim 1 in which the plasma etching process is a cyclic etch and deposition process.

18. A method according to claim 1 in which the method is carried out without irradiating the substrate with a source of radiation dedicated for producing any infrared radiation emanating from the substrate and monitored to control the plasma dicing process.

19. A method according to claim 1 in which the plasma etching progresses through the substrate from a first surface of the substrate towards an opposite second surface of the substrate, and in which is a tape is attached to the second surface of the substrate, wherein the increase in infrared radiation is detected to determine that the condition exists before the tape is exposed during the plasma etching, and at least one process variable is altered before the tape is exposed during the plasma etching in response to the determination that the condition exists.

20. A method according to claim 1 in which the plasma etching progresses through the substrate from a first surface of the substrate towards an opposite second surface of the substrate, wherein the increase in infrared radiation is detected to determine that the condition exists before the second surface of the substrate is reached during the plasma etching, and at least one process variable is altered before the second surface of the substrate is reached during the plasma etching in response to the determination that the condition exists.

* * * * *